United States Patent
Fink et al.

(10) Patent No.: US 7,856,299 B2
(45) Date of Patent: Dec. 21, 2010

(54) CHECKING OF REPAIRS FOR ELECTRONIC VEHICLE SYSTEMS

(75) Inventors: Bernhard Fink, Köngen (DE); Peter Irkes, Auenwald (DE); Markus Scholz, Winnenden (DE); Klaus Weiss, Gruibingen (DE)

(73) Assignee: DaimlerChrysler AG, Stuttgart (DE)

( * ) Notice: Subject to any disclaimer, the term of this patent is extended or adjusted under 35 U.S.C. 154(b) by 607 days.

(21) Appl. No.: 11/791,941

(22) PCT Filed: Aug. 23, 2005

(86) PCT No.: PCT/EP2005/009076

§ 371 (c)(1),
(2), (4) Date: May 31, 2007

(87) PCT Pub. No.: WO2006/024423

PCT Pub. Date: Mar. 9, 2006

(65) Prior Publication Data

US 2009/0132110 A1    May 21, 2009

(30) Foreign Application Priority Data

Aug. 28, 2004   (DE) .................. 10 2004 041 740

(51) Int. Cl.
*G01M 17/00* (2006.01)
(52) U.S. Cl. ............................. 701/33; 701/29; 701/36
(58) Field of Classification Search .................. 701/29, 701/33, 36; 702/182–183
See application file for complete search history.

(56) References Cited

U.S. PATENT DOCUMENTS 4,271,402 A    6/1981    Kastura et al.
(Continued)

FOREIGN PATENT DOCUMENTS

DE    199 21 845    11/2000
(Continued)

OTHER PUBLICATIONS

International Standard, ISO 14229, "Road Vehicles—Diagnostic Systems—Diagnostic Services Specification," First Edition, Jul. 15, 1998.
(Continued)

*Primary Examiner*—Yonel Beaulieu
(74) *Attorney, Agent, or Firm*—Fitch, Even, Tabin & Flannery; Norman N. Kunitz

(57) ABSTRACT

The solution is arrived at with a computer-based diagnostic tester which can exchange information with the control devices installed in the motor vehicle using a diagnostic program via a diagnostic interface and via data lines. The motor vehicle-mounted control devices have program routines for self-diagnostics of the control devices and are capable of storing identified faults in the form of fault codes in reserved memory areas. The diagnostic program which is implemented in the diagnostic tester reads the fault codes out from the reserved memory areas, interprets the fault codes and displays them on a display together with the interpretations. In order to check to what extent repairs which have been performed have been successfully concluded, status polling is carried out using the diagnostic program implemented in the diagnostic tester. During this status polling, the status information of all the fault codes known in the system is interrogated and evaluated. In the process, all the fault codes whose fault setting conditions have either been tested positively or whose test requirements were not present in order to be able to carry out a test are displayed. A method for improved checking of repairs is also presented with the diagnostic tester.

16 Claims, 6 Drawing Sheets

U.S. PATENT DOCUMENTS

| | | | |
|---|---|---|---|
| 4,926,352 A | 5/1990 | Staffe | |
| 5,265,468 A | 11/1993 | Holst et al. | |
| 6,809,837 B1 * | 10/2004 | Mestha et al. | 358/1.9 |
| 6,862,589 B2 * | 3/2005 | Grant | 707/779 |
| 7,251,535 B2 * | 7/2007 | Farchmin et al. | 700/26 |
| 7,305,291 B2 * | 12/2007 | Koenig et al. | 701/36 |
| 7,421,371 B2 * | 9/2008 | Segers et al. | 702/183 |

FOREIGN PATENT DOCUMENTS

| | | |
|---|---|---|
| EP | 0 819 928 | 1/1998 |
| JP | 07271589 | 10/1995 |
| JP | 09210865 | 8/1997 |

OTHER PUBLICATIONS

International Standard, ISO 14230-2, "Road Vehicles—Diagnostic Systems—Keyword Protocol 2000—Part 2: Data Link Layer," First Edition, Mar. 15, 1999.

International Standard, ISO 14230-3, "Road Vehicles—Diagnostic Systems—Keyword Protocol 2000—Part 3: Application Layer," First Edition Mar. 15, 1999.

SAE International Surface Vehicle Standard, Superseding J1979, Sep. 1997.

* cited by examiner

CHECKING OF REPAIRS FOR ELECTRONIC VEHICLE SYSTEMS

CROSS REFERENCE TO RELATED APPLICATION

This application is the National Stage filing under 35 U.S.C. 371 of International Application No. PCT/EP2005/009076, filed Aug. 23, 2005, and claims priority of German Patent Application 10 2004 041 740.7, filed Aug. 28, 2004 the subject matter of which in its entirety, is incorporated herein by reference.

BACKGROUND OF THE INVENTION

The invention relates to a diagnostic system and a diagnostic tester for checking motor vehicle control devices with which not only is it possible to find faults, as previously customary, but also with which it is likewise possible to check whether a repair which has been performed was successful. The diagnostic tester is likewise used to present a method for the improved checking of repairs.

Diagnostic systems and diagnostic testers for motor vehicle control devices are nowadays predominantly computer based in motor vehicle workshops. BMW were leaders in the introduction of computer-based diagnostic testers in 1994 with the diagnostic system BMW-DIS which set the standard for contemporary diagnostic systems and diagnostic testers in motor vehicle workshops. This system is described, for example, in the vocational training manual by Rauner/Schreier/Spöttel: "Die Zukunft computergestützter Kfz-Diagnose [The future of computer-supported motor vehicle diagnostics]" published by Bertelsmann in Bielefeld, 2002, ISBN 3-7639-3022-1. The following diagnostic testers have repeatedly resorted to the basic structure of this diagnostic system. For example, there is also a German patent application by Bosch, DE 199 21 845 A1 which is mentioned here by way of example because it summarizes this basic structure in a particularly concise and brief way. A diagnostic test device for motor vehicles is described in which programmable control devices are provided with self-diagnostic means in the motor vehicle, said means using program control to control and monitor the engine controller and other systems of the motor vehicle, generate fault codes and store them and said means can be connected to an external diagnostic tester via a motor vehicle-mounted diagnostic/test plug. The invention is also based on such a basic structure for a diagnostic tester.

The interface or the diagnostic plug for connecting an external diagnostic tester to the motor vehicle-mounted control devices was in the past, and is to a certain extent still today, the object of efforts at standardization. In particular in the USA these efforts at standardization with which access to motor vehicle-mounted control devices, and thus the ability to perform diagnostics on them, is made possible and regulated, still involve measures by legislators. A standard which has become established is referred to as the keyword protocol 2000. The standardization bases for this keyword protocol 2000 can be found in the international standard ISO 14 230-3, which is concerned with the application layer, and in ISO 14 230-2 which is concerned with what is referred to as the data link layer. A supplementary standard on which the keyword protocol 2000 is based and which has become a component of the abovementioned standards is the service vehicle standard SAE J1979. In particular the possibilities for reading out the data memories in the control devices which are provided for a diagnostic tester by the keyword protocol 2000 are significant for the invention described here.

Known diagnostic systems and diagnostic testers are restricted to reading out existing fault codes from the control devices in the motor vehicle, processing and interpreting them with a diagnostic program and displaying the result of this interpretation on a screen of the diagnostic tester. In the motor vehicle workshop, a motor vehicle mechanic then works through the displayed list of deficiencies, during which process he can call up further information about the individually specified deficiencies using the diagnostic tester. In this context, further technical information resources such as technical drawings and of course the repair instructions with which he can eliminate the detected fault are of particular interest for him. If the motor vehicle mechanic has worked through the list of deficiencies, he uses the diagnostic tester to clear the stored and read-out fault codes in the motor vehicle-mounted control devices and in the diagnostic tester itself. Final checking as to whether the repairs which have been performed were successful or whether consequential faults have arisen as a result of the repair, is performed with a final test drive depending on the working organization in the motor vehicle workshop. Diagnostic systems and diagnostic testers which are known to the patent applicant do not support the quality checking of the repairs performed. They are not suitable for this either since the list of deficiencies and the fault codes in the control devices are cleared by the motor vehicle mechanic by a clear command. Of course, as a result the information about a malfunction which has occurred once and been detected is lost. Therefore, until now a diagnostic tester did not provide a motor vehicle mechanic with any support as to whether or not his repair was successful.

SUMMARY OF THE INVENTION

Taking the previously described prior art as a starting point, the aim of the invention is therefore to specify a diagnostic system and a diagnostic tester which permit improved checking of repairs using the diagnostic tester.

This object is achieved with a diagnostic system and a diagnostic tester corresponding to the independent claims. Advantageous embodiments of the invention are presented in the dependent claims or clarified in the following description.

The solution is arrived at with a computer-based diagnostic tester which can exchange information with the control devices installed in the motor vehicle using a diagnostic program via a diagnostic interface and via data lines. The motor vehicle-mounted control devices have program routines for self-diagnostics of the control devices and are capable of storing identified faults in the form of fault codes in reserved memory areas. The diagnostic program which is implemented in the diagnostic tester reads the fault codes out from the reserved memory areas, interprets the fault codes and displays them on a display together with the interpretations. In order to check to what extent repairs which have been performed have been successfully concluded, status polling is carried out using the diagnostic program implemented in the diagnostic tester. During this status polling, the status information of all the fault codes known in the system is interrogated and evaluated. In the process, all the fault codes whose fault setting conditions have either been tested positively or whose test requirements were not present in order to be able to carry out a test are displayed.

Status polling mainly has the advantage that not only those faults whose fault setting conditions were once positively met in the past but also the potentially possible faults whose functions could not be checked because the test requirements were not present for this are displayed in the form of fault codes on the diagnostic tester. In order to support the workshop mechanic in the motor vehicle workshop, the status polling points to the display of the diagnostic tester as long as a list of deficiencies appears, until all the identified faults and also all potential faults have been tested in accordance with the test requirements and the test result has not yielded a positive infringement of a fault setting condition. For repair measures which have been carried out this means that the repair measure is not concluded until the test requirements for the repair measure which has been carried out have been run through at least once with the diagnostic tester and this run has shown that there is no longer a fault setting condition present for the measure checked.

In one advantageous embodiment of the invention, the clearing of fault codes using the diagnostic tester is tied to the fact that at least one further diagnostic run has been carried out for the fault code to be cleared, the test requirements for checking the respective fault codes having been met during this diagnostic run and the test result revealing that there are no longer any faults. This has the advantage that once faults have been diagnosed they cannot then be cleared by the workshop mechanic until a repair which has possibly been carried out has been monitored and checked at least once with the diagnostic tester and found to be satisfactory. Incorrectly carried out repair measures can thus be identified using the diagnostic tester directly after the repair. It is even more important that with the prescribed status polling those potential fault possibilities which were only found to be satisfactory because the test requirements for appropriate checking were not present are also identified. This is significant in particular if a repair is to be carried out by completely exchanging a control device. According to the previously known prior art, each diagnostic tester would find the newly installed control device to be satisfactory only because no fault codes were stored in its fault memory. On the other hand, with the invention the repair measure is not regarded as concluded until the control device has been tested using the diagnostic tester at least once in accordance with the test requirements applicable for the control device and no faults could be found in the process. The menu prompting or the screen display of the diagnostic tester such as is described here, alerts the workshop mechanic to fault possibilities which have not been tested and in the process helps him to think of checking the executed repair measures at least once in a satisfactory fashion. The test requirements for each known fault code are appropriately implemented here in the diagnostic program of the diagnostic tester so that the workshop mechanic does not need to commit to memory the predefined test requirements for each possible fault in the motor vehicle.

In one advantageous embodiment of the invention, the status check is initiated by the motor vehicle mechanic using the diagnostic tester. To do this, during the menu prompting of the diagnostic tester a menu item which is reserved for the status polling and during the activation of which a status check of the fault displayed by the diagnostic tester is performed can be provided. This has the advantage that the motor vehicle mechanic can use the diagnostic tester near to the repair and whenever he believes he has concluded a repair measure he can check this repair measure immediately with the diagnostic tester.

In another embodiment of the invention, the status checking of the diagnostic tester can be initiated automatically whenever a deficiency indicated by the diagnostic tester is to be cleared. In this case, the starting of the status poling is tied to the calling of the delete function for the resetting of the fault codes in the control devices.

In less preferred embodiments of the invention, the status checks can be started automatically by the diagnostic tester in that, for example after the diagnostic tester has been connected to the diagnostic interface of the motor vehicle, a status check of the fault codes is initiated and carried out by the diagnostic tester at regular time intervals. For this purpose, a clock can run concurrently and a status check can be carried out, for example triggered automatically every 10 minutes.

In one further embodiment, in the diagnostic tester the functions for clearing the fault codes which have been written into the fault memories of the control devices in the motor vehicle during a diagnostic routine are blocked until a status check is carried out by means of a further diagnostic routine, and both fault-free functioning of the executed repair measure and correct checking of the repair measure have been carried out by reference to the test requirements prescribed for the respective repair. This embodiment has the advantage that for the motor vehicle mechanic the repair is not ended until all the faults have been eliminated and have also been satisfactorily checked. Random clearing of fault codes once they have been detected by means of clear commands such as individual fault clearing or a complete reset of all the fault memories can then no longer lead to a service which appears to be satisfactory.

BRIEF DESCRIPTION OF THE DRAWINGS

Without restricting the generality, the invention will be explained in more detail below using graphic illustrations, in which.

DETAILED DESCRIPTION OF THE INVENTION

Figure 1:
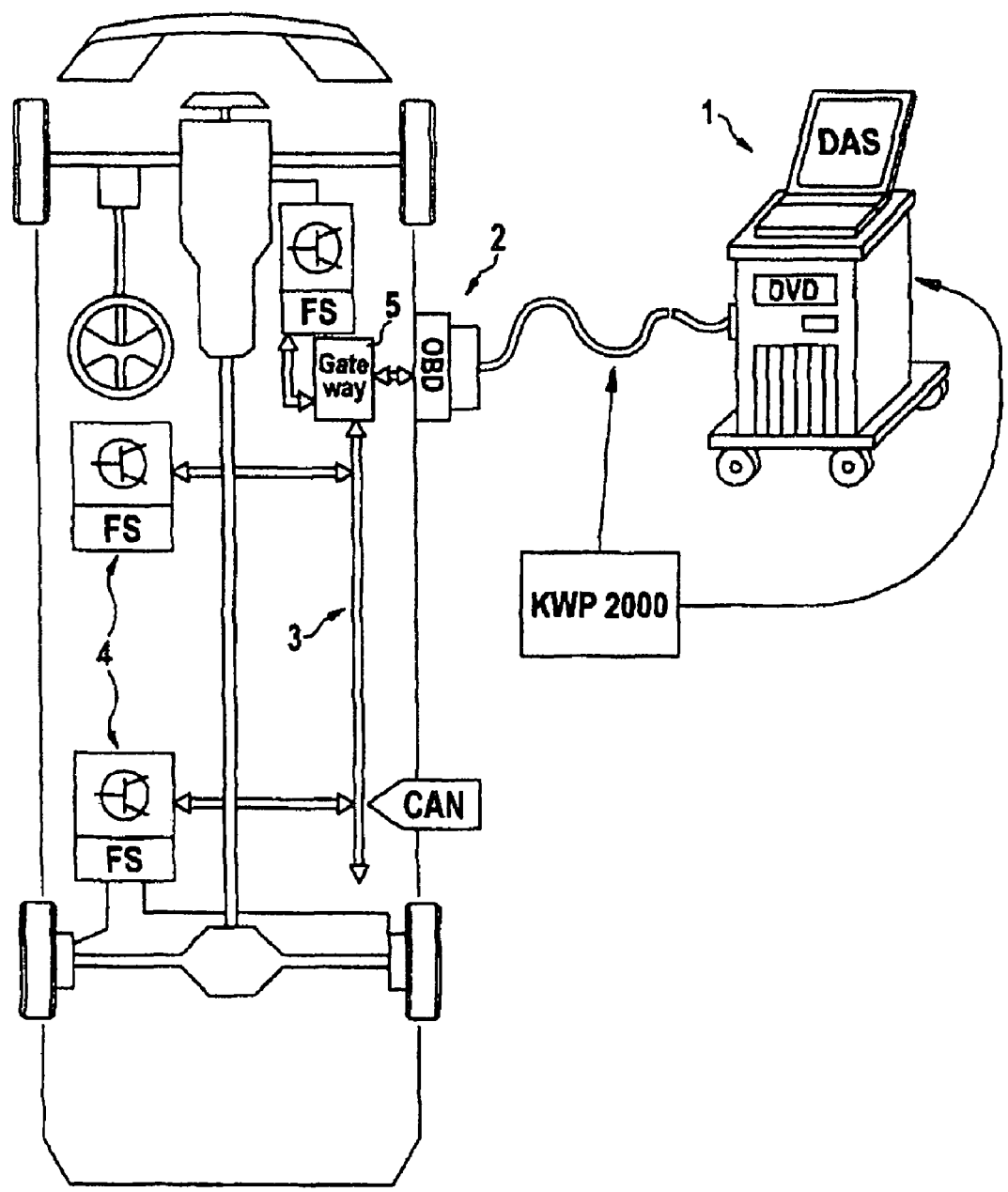
FIG. 1 shows a schematic illustration of a diagnostic tester such as is connected to the control devices in a motor vehicle.

FIG. 1 is a schematic illustration of a situation such as is known today in motor vehicle workshops. For the diagnostics of a motor vehicle, a computer-supported diagnostic tester 1 is connected via a standardized diagnostic interface 2 to the communications network 3 for the control devices 4 in the motor vehicle. Known diagnostic testers are, for example, the DAS system from DaimlerChrysler or the BMW-DIS system which has already been mentioned in the introduction to the description. The control devices 4 installed in the motor vehicle have a communication connection to one another for example via a data bus. A widespread data bus in motor vehicles is here what is referred to as the CAN (Control Area Network) bus. Each of the installed control devices in the motor vehicle has both the communications interfaces and a self diagnostic capability. Within the scope of the self diagnostics of the control devices, faults which have been detected in the control devices using the diagnostic routine are written in codified form as what are referred to as fault codes by the control device software into specially reserved memory areas, referred to as fault memories. In the schematic illustration in FIG. 1, these reserved, nonvolatile memory areas are designated by FM (for fault memory). For communication and for exchange of data between a diagnostic tester and the control devices installed in the motor vehicle a standard has become established which is known by the name keyword protocol 2000 and the specification and standardization of which are repeated in the ISO standard 14 230-3. Insofar as is necessary to understand the invention, more details are also given on this keyword protocol 2000 below in relation to FIG. 2. The control commands and data formats agreed in the keyword protocol 2000 make it possible to read out the codified contents of the fault memories of the individual control devices via the diagnostic interface using the diagnostic tester and to transmit them into the computing system of the diagnostic tester. The standard for the keyword protocol 2000 comprises here two different application possibilities. On the one hand, the standard provides for the communication between the diagnostic tester and control devices to take place via a gateway 5 which, for example, connects the motor vehicle CAN bus to the diagnostic interface 2, or else, as was customary earlier, provides that the fault memories of the control devices can be read out directly into the diagnostic tester via what are referred to as the K and L lines and via the standardized diagnostic interface 2 and stored. In the schematic illustration in FIG. 1, the modern form of access via a CAN bus and thus via a gateway is illustrated. All that is significant for the invention is that there is at least one possible way of being able to read out the fault memories of the control devices using a diagnostic tester. The invention therefore covers all the addressing possibilities between the diagnostic tester and fault memories of the control devices. The keyword protocol 2000 used is also merely one preferred possible way of being able to transfer the data contents of the fault memories from the control devices into the diagnostic tester particularly easily.

Figure 2:
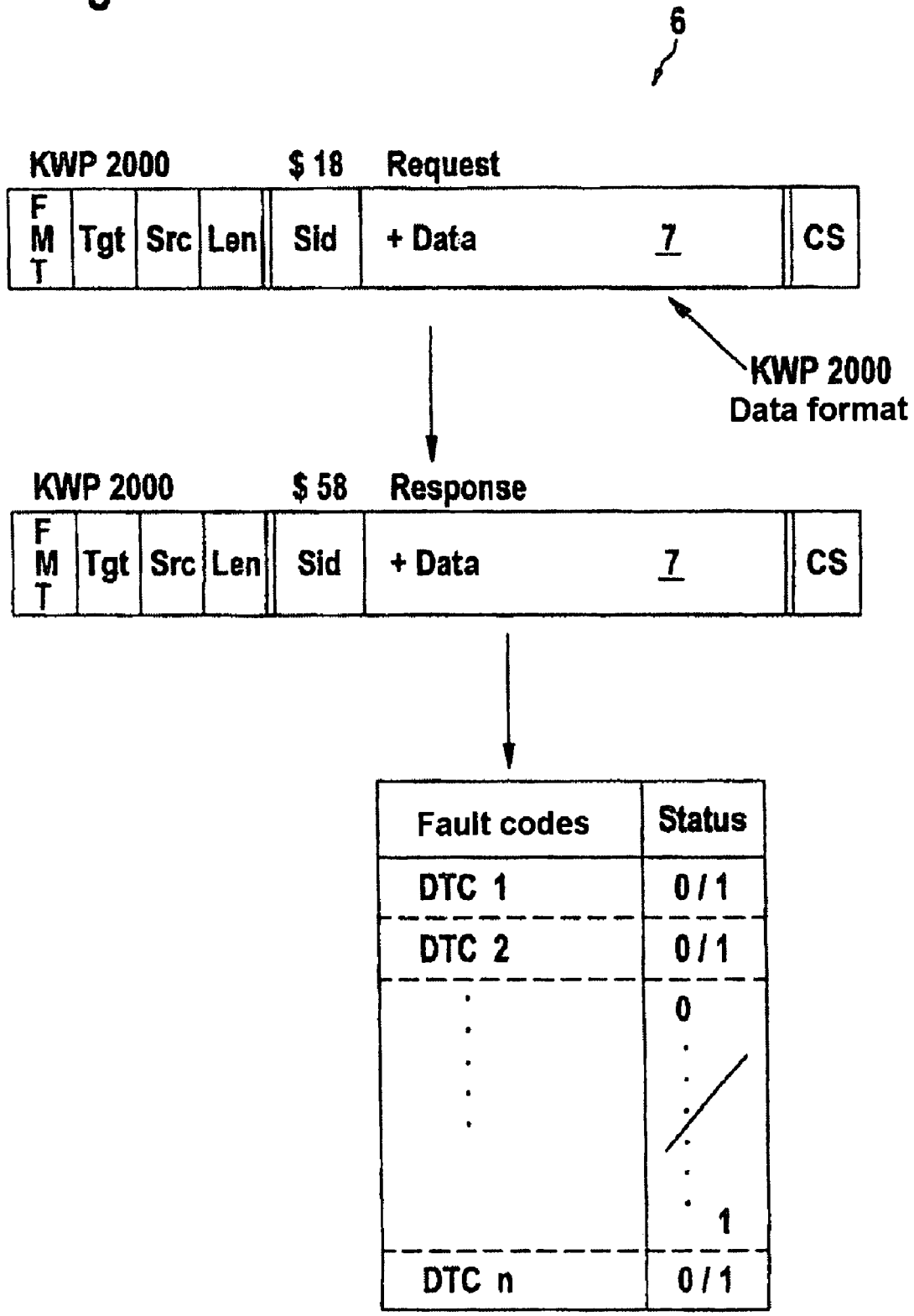
FIG. 2 shows a schematic illustration of data formats such as are agreed in the keyword protocol 2000.

The schematic illustration in FIG. 2 briefly gives details on the keyword protocol 2000. Complete and more detailed information can be found by a person skilled in the art in the ISO standard 14 230-3 already mentioned. The keyword protocol 2000 has defined, specifically for the purposes of motor vehicle diagnostics, a data format and a minimum scope of codified control commands which a control device must at least be able to process in the motor vehicle if it is to correspond to the keyword protocol 2000. The data format used by the keyword protocol is based on the ISO standard 14 230-2, referred to as the data link layer for the keyword protocol 2000. The structure of such a data format includes up to four different header bytes which contain information about the data format FMT, information about the target address TGT, information about the sender address SRC and information about the length of the data bytes following the header bytes. The header block is always followed by a hexadecimal-codified control command, which is referred to as a service identification SID. The control commands specified in the keyword protocol 2000 can be further subdivided and refined here in a manufacturer-specific fashion. In this case, the useful data block 7 would contain further hexadecimal-codified control commands. The data format corresponding to the keyword protocol 2000 is always concluded with a byte which contains a checksum CS over all the data of the respective message format. The message format just described is used in its basic structure both for enquiries to the control devices and for the responses of the control devices. What is referred to as the $18 requests with the associated $58 response which each keyword protocol 2000-enabled system must contain and be able to process are of particular interest for the invention here. The requests and the response are codified here merely using the hexadecimal coding means 18 or 58 in order to determine the service identification, and thus determine the useful data which is to be transmitted and which has to be contained in the response. The dollar symbol is merely used here in this patent application to show that the numerical code 18 or 58 is a codified control command corresponding to the keyword protocol 2000. If a control device receives an $18 request in a motor vehicle from a diagnostic tester, it always responds with a $58 response. The useful data of the response are always contained here in the data block 7 of the response message. The keyword protocol 2000 defines here not only the control commands but also specifies the data contents which a standardized response to a standardized enquiry has to contain. For example, it is defined that the associated §58 response to an $18 request in the data block for each fault code DTC1, DTC2-DTCn known in the control device, the respective status of this fault code is also transmitted. The status of the fault code indicates here whether or not the self-diagnostic routine of the control device has tested the fault code. In the simplest case, the status can be composed of an individual bit, for example the bit value "0" stands for satisfactory checking of the functions assigned to the fault code in accordance with the test requirements, while the bit value "1" stands for a non-tested fault code or for a test run of the corresponding functions during which the test requirements were not present. Of course, any other coding means which is capable of deciding whether or not the status of a fault code has been tested in accordance with the test requirements for the functions on which the fault code is based can also be selected. The $58 response therefore contains, in the data block 7, a table with all the fault codes known in the control device, with the additional status information. With an $18 request it is thus possible, either by setting corresponding parameters at the request itself or by subsequent selection of the data block of the associated $58 response, to identify and read out selectively all those fault codes whose status shows that the associated functions have not been tested satisfactorily in accordance with the test requirements for these functions. This information can be acquired completely independently of whether a malfunction was present or whether a fault code has been verified and has or has not been stored in the corresponding fault memory. In other words, it is possible to also interrogate non-activated fault codes about their status. The keyword protocol 2000 should be considered a particularly widespread embodiment variant in conjunction with the invention. The invention itself is not restricted to the keyword protocol 2000 but rather can also be carried out with any type or form of data transmission during which not only activated fault codes but also their status information can be read out and selected.

Figure 3:
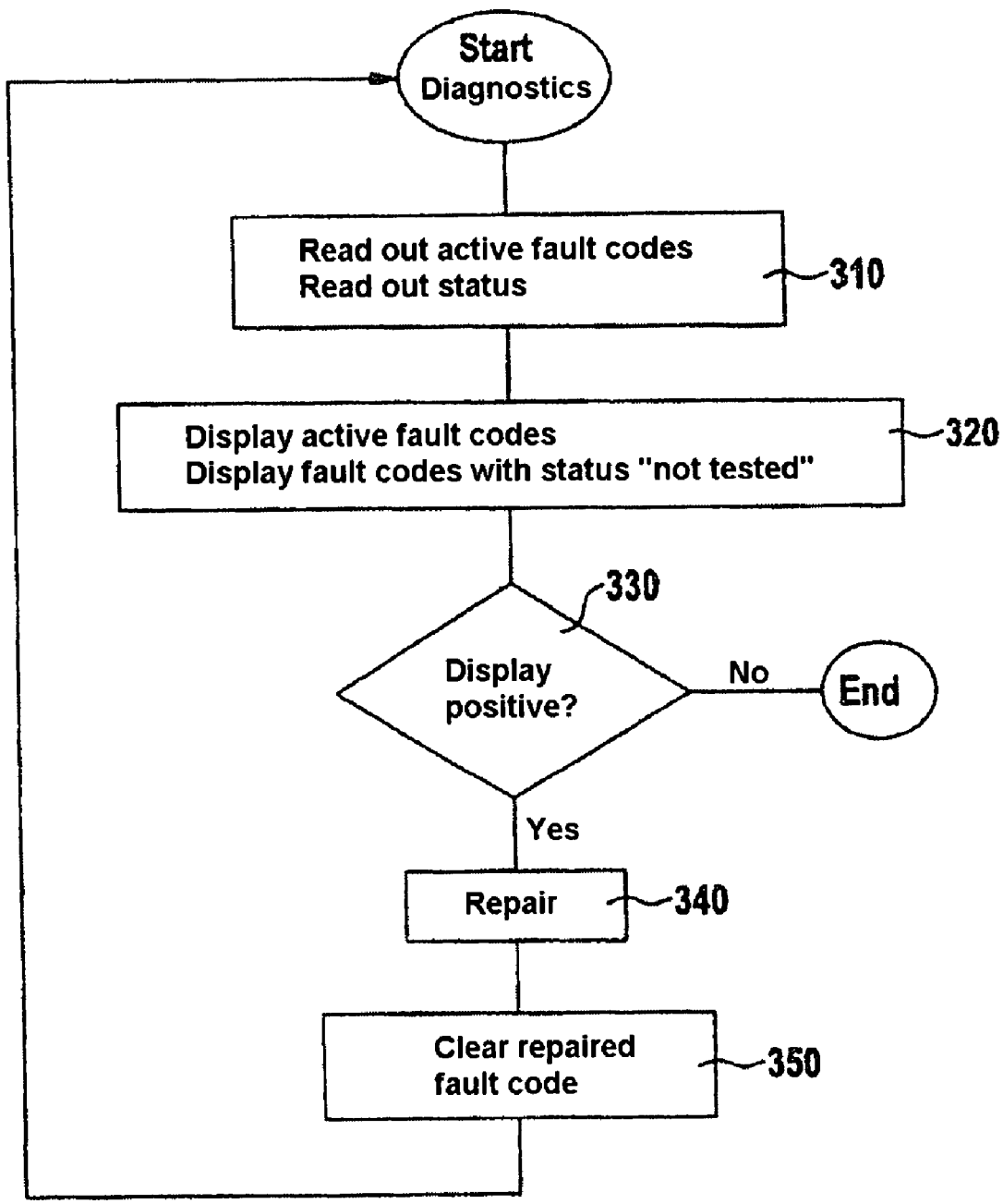
FIG. 3 shows a flowchart showing improved checking of a repair using a diagnostic tester.

In accordance with the above-described principles, details will now be given on the core of the invention in relation to FIGS. 3 to 6. FIG. 3 shows a flow chart for possible improved checking of repairs. After the diagnostic tester has been connected to the diagnostic interface of the motor vehicle, a diagnostic session can be started with the diagnostic program implemented in the diagnostic tester. For this purpose, the data contents of the fault memories of the control devices in the motor vehicle are read out in a first step 310. Here, all the fault codes which have been verified and activated by the self diagnostic routines of the control devices are read out. However, in contrast to the previously known prior art, according to the invention not only are the active fault codes read out but also the status information is read out with a suitable interrogation for all the fault codes known in the system. The data which is read out in this way is further processed in the diagnostic tester. After appropriate selection, all the active fault codes are displayed on a suitable display of the diagnostic tester, if appropriate with further explanations. The list of active fault codes is supplemented here according to the invention with those fault codes whose status interrogation has revealed that they have not been tested by the self diagnostic routines of the control devices. As a result, fault codes which are not active but which constitute potential fault candidates as a result of the lack of checking are also displayed. The selection and display of the fault codes can be combined in one processing step by the diagnostic program, which is represented symbolically by the program step 320 in FIG. 3. By reference to the displayed fault list, the motor mechanic decides whether or not he wishes to carry out a repair. The result of this decision can be interrogated in the menu prompting of the diagnostic tester with a decision step 330. However, in an alternative embodiment, it is possible to dispense with this decision step in the menu prompting of the diagnostic tester. However, after a repair 340 has been carried out an identified fault code has to be cleared in the respective fault memory of the respective control device in every case. In previously known diagnostic testers, all the fault codes which were located in fault memories of control devices in a motor vehicle could be cleared at any time and without further checking. The invention consists in the fact that repairs are checked after a fault code has been cleared or after an attempt to clear a fault code has been made with the diagnostic tester and with the self diagnostic routines of the control devices. This checking of repairs is carried out by virtue of the fact that the self diagnostic routines of the control devices are started once more after an attempt to clear a fault code. The processing steps 310 and 320 are run through again. The repair has ended successfully if neither active fault codes nor fault codes with the status "not tested" are displayed on the diagnostic tester. This program loop ensures that the repair measures which have taken place have been tested at least once. If it was not possible to carry out a successful test because, for example, the test requirements for a diagnostic run were not met, this failed checking is detected with the interrogation of the fault codes with the status "not tested" and is displayed to the motor vehicle mechanic on the display of the diagnostic tester. In this case, the repair would not have been checked and the motor vehicle mechanic is informed that the test requirements for a check were not met.

Figure 4:
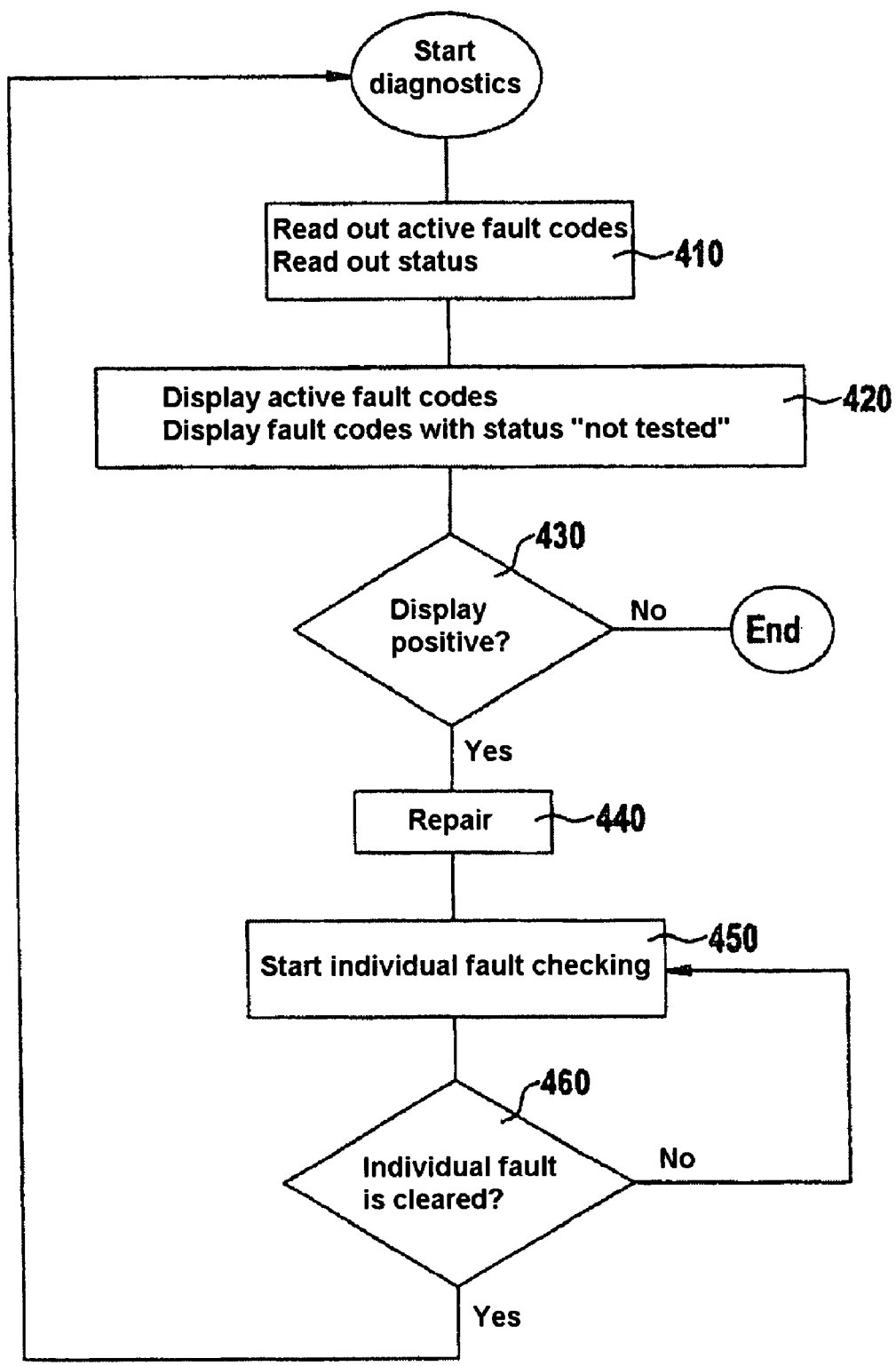
FIG. 4 is a further possible flowchart for improved checking of repairs using a diagnostic tester.

A further exemplary embodiment according to the invention is illustrated with the program flowchart in FIG. 4. Here too, after the connection of a diagnostic tester to the diagnostic interface of the motor vehicle the self diagnostic routines of the control devices located in the motor vehicle are started, or at least the fault codes stored in the fault memories of the control devices are read out, with said diagnostic tester. In addition to the verified and activated fault codes, the status information relating to the fault codes is read out and further processed. Finally, all the active fault codes and all the fault codes with the status "not tested" are displayed on the display of the diagnostic tester. The processing steps 410 and 420 correspond here precisely to the processing steps 310 and 320 according to the flowchart from FIG. 3. In the exemplary embodiment in FIG. 4, the decision by the motor vehicle mechanic as to whether or not he wishes to carry out a repair can also be documented by menu interrogation 430, or else not. If the motor vehicle mechanic decides to carry out a repair, according to the exemplary embodiment for the checking of repairs according to the flowchart in FIG. 4 he can start individual fault checking 450 after each repair step which has been carried out. Individual fault checking can be appropriate in particular if the diagnostic tester displays four different fault codes. The motor vehicle mechanic can then firstly select a fault code by a pull down menu, call the associated repair instructions and cause them to be displayed on the diagnostic tester, then carry out the repair 440 and once the repair has been completed he can start this actual individual fault checking 450. Starting the individual fault checking causes a repair checking process to be carried out with the diagnostic tester for the selected fault code. The repair checking process is carried out by starting the self diagnostic routine of the respective control device and by status checking of the currently repaired fault code. If the self diagnostic routine of the control device can check the queried fault code satisfactorily, and if this check reveals that the fault code is now no longer active, the respective fault code is removed from the fault list of the diagnostic tester by an individual fault clearing process. For the motor vehicle mechanic this has the advantage that he can work through the repair list point by point and whenever he thinks that he has eliminated the selected deficiency point he can check this immediately by an individual fault checking process using the diagnostic tester. The partial repair is considered to be successful here if the respective individual fault from the fault list of the diagnostic tester is no longer displayed.

These facts are illustrated in the flowchart in FIG. 4 with the program step 460.

As an alternative to the individual fault clearing process, the motor vehicle mechanic can of course also initially carry out all the displayed repairs and then cause a repair checking process to be carried out for all the previously queried fault codes using the diagnostic tester. This would correspond to the flow chart in FIG. 3. The selection as to which procedure the motor vehicle mechanic selects is at his own discretion. With the diagnostic tester according to the invention it is possible to implement both charts for the checking of repairs.

Figure 5:
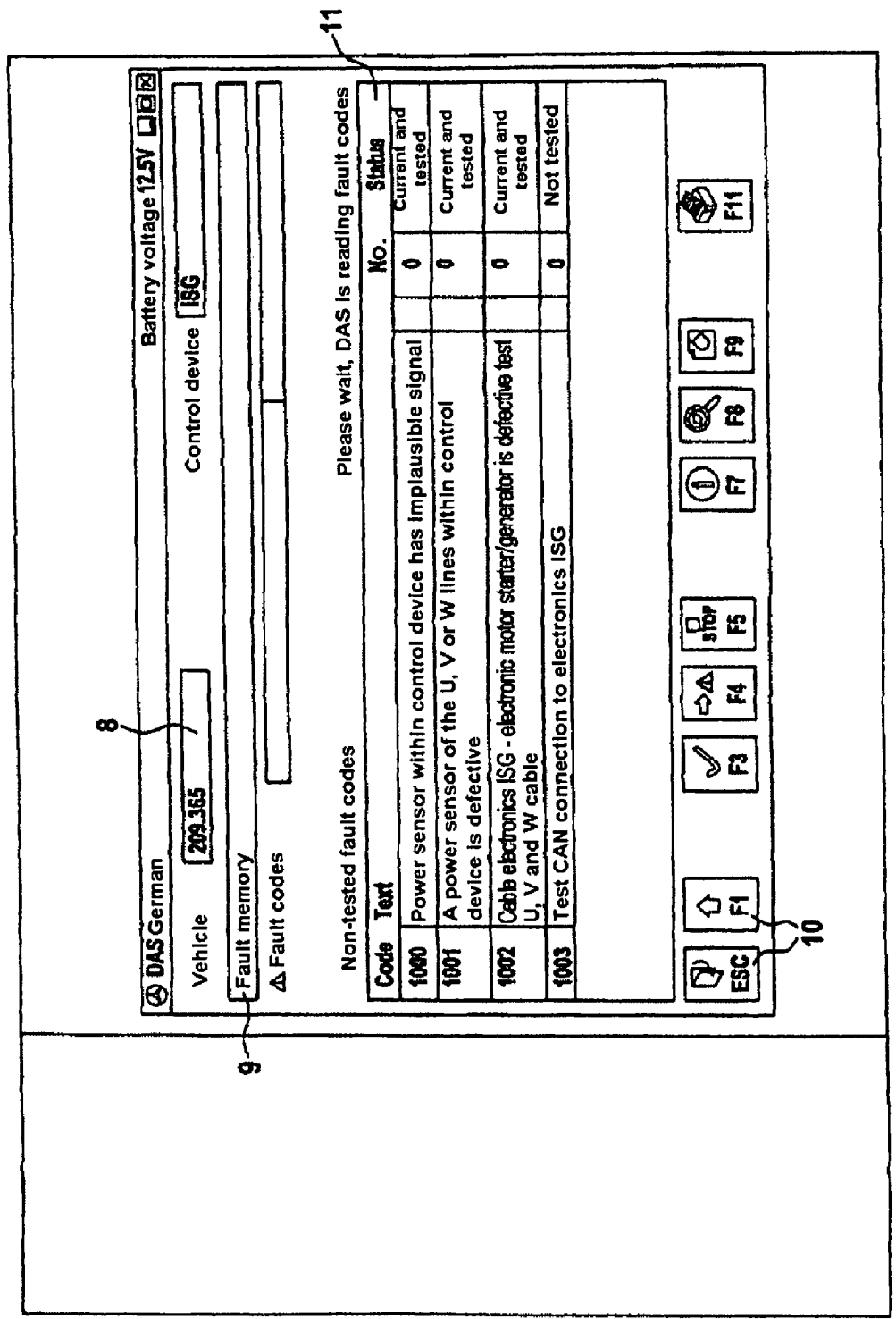
FIG. 5 shows a graphic user interface such as is displayed to the motor vehicle mechanic by the diagnostic tester.
Figure 6:
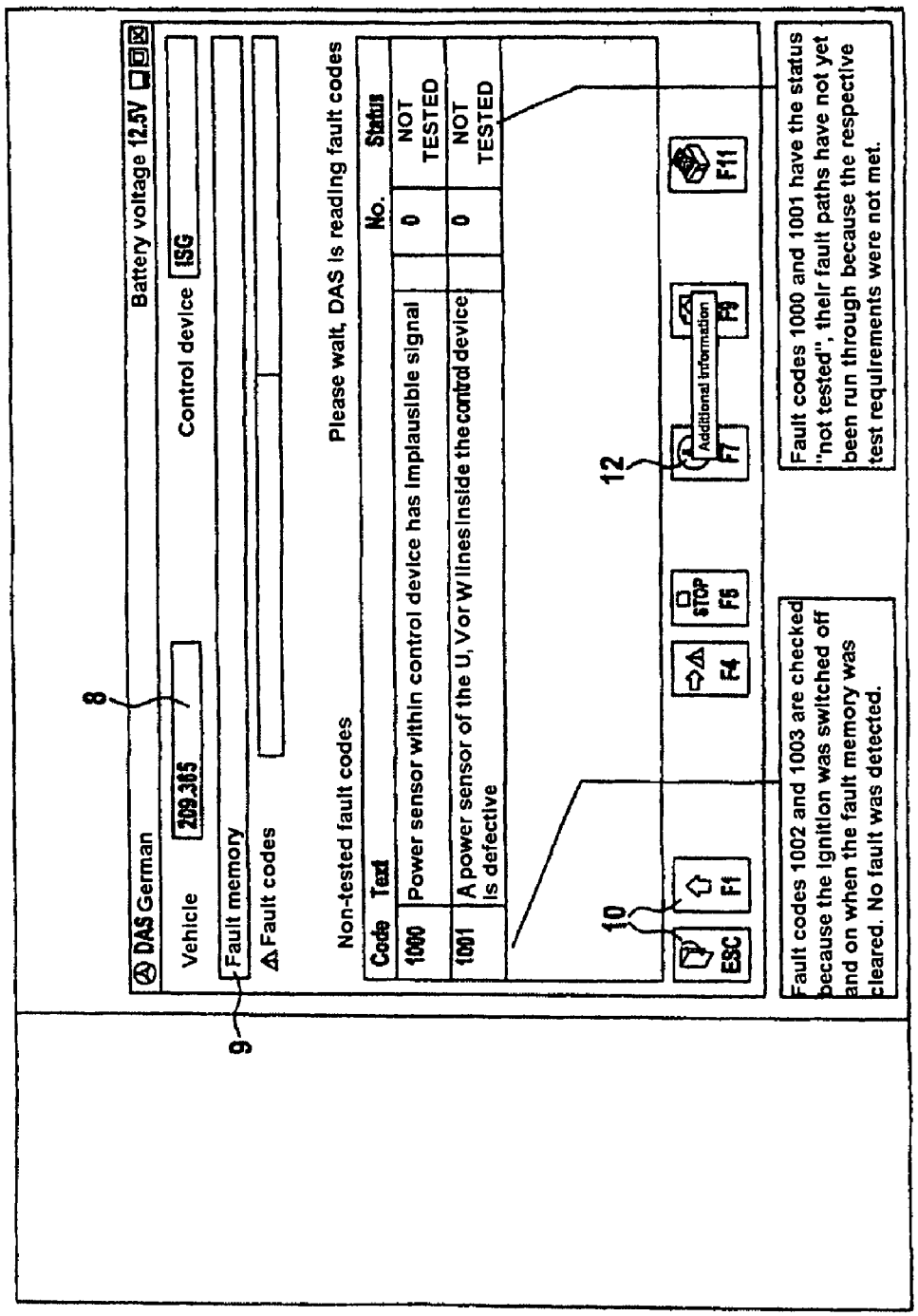
FIG. 6 shows the graphic user interface of the diagnostic tester according to FIG. 5, in the form in which it appears to the motor vehicle mechanic after the repairs have been carried out but the repairs themselves have not been satisfactorily checked.

FIGS. 5 and 6 illustrate how the improved checking of repairs can be implemented using the diagnostic tester. Typical screen shots of the display on the diagnostic tester are illustrated. In addition to information relating to the examined vehicle 8 relating to the displayed data content 9, the diagnosis mechanic is provided, on the user interface of the diagnostic tester in the form of what are referred to as buttons 10, with operator control elements with which he can control and operate the diagnostic tester. The main point of the invention is to additionally display all the untested fault codes which could be found by the diagnostic tester in the control devices of the motor vehicle in addition to the activated fault codes. In the illustrated example, these are the fault codes 1000, 1001 and 1002. According to the invention, status information is also interrogated for each fault code and displayed on the display of the diagnostic tester. The display can be, for example, in the form of a column 11 with the name "status" in which the corresponding status information for each fault code is then stored after having been tested or not tested. However, not only the activated fault codes which are referred to as current in the display according to FIG. 5 are displayed but also those fault codes which have the status "not tested" are displayed. In the exemplary embodiment in FIG. 5, this is the fault code 1003. The screen shot according to FIG. 5 is intended to illustrate by way of example the display which is displayed to the motor vehicle mechanic on the diagnostic tester after the diagnostic tester has been connected to the diagnostic interface and after transmission of data has occurred and after data selection has occurred. The motor vehicle mechanic can call up further information relating to the individual fault codes using the operator control button 10 by menu prompting, for example by means of a pull down menu. For example, the repair instructions which relate to the respective fault code and which are generally likewise integrated and stored in the diagnostic program of the diagnostic tester are of particular interest. Operator control buttons 10, for example F3, can be used by the motor vehicle mechanic to initiate the individual fault checks described above for a specific fault code or to start checking of a repair, for example using the operator control button F7, after a total repair has been carried out.

A possible result of checking of a repair which has been carried out in this way is illustrated with the screenshot according to FIG. 6. In the exemplary embodiment which is selected by way of example according to FIG. 5, all the repairs relating to the fault codes 1000, 1001, 1002, 1003 have been carried out. However, the checking of repairs which has then been started has shown that for two of the four fault codes the test requirements to test the satisfactory function of the respective functions using the self-diagnostic routines of the respective control devices were not met. For this reason, this fact is displayed to the motor vehicle mechanic. He is given an indication of which fault code which was previously found to be deficient could not be tested after the repair had occurred. The prescribed test requirements are particularly expediently also stored for each fault code in the database system of the diagnostic tester. A specific information button 12 whose activation allows additional information about a selected fault code, for example fault code 1000, to be called up by menu selection is expediently implemented for calling up these test requirements. This additional information can contain not only the test requirements but also information about which test requirements were not met. In the illustrated exemplary embodiment the necessary minimum rotational speed of the on-board power system generator might not have been reached so that the untested power sensors fault code 1000, 1001 cannot be tested at all. The motor vehicle mechanic is then provided with a message that he must increase the rotational speed of the motor vehicle engine to at least, for example, 2000 revolutions per minute for successful checking.

Checking of repairs is not concluded successfully until the diagnostic tester no longer displays any fault codes.

The invention claimed is:

1. A computer-based diagnostic tester with a diagnostic program and a diagnostic interface for connecting the diagnostic tester to a group of control devices on which diagnostics are to be performed, characterized in that fault codes and status information relating to fault codes are read out and evaluated from the control devices, using the diagnostic program, and in that all the fault codes whose fault setting conditions are met and all the fault codes whose status information indicates that the respective fault codes have not been checked are displayed using the diagnostic tester.

2. The diagnostic tester as claimed in claim 1, characterized in that fault codes are removed from the display of the diagnostic tester only if a status check has yielded that a successful diagnostic run has taken place for the fault codes to be cleared in the control devices.

3. The diagnostic tester as claimed in claim 1, characterized in that the status information of selectable fault codes can be interrogated during a repair.

4. The diagnostic tester as claimed in claim 1, characterized in that the status checking is carried out whenever a fault code has been cleared.

5. The diagnostic tester as claimed in claim 1, characterized in that the status check is triggered on a timed basis.

6. The diagnostic tester as claimed in claim 1, characterized in that the removal of fault codes from the display of the diagnostic tester is blocked for those fault codes whose status information in the control devices indicate an untested state.

7. A diagnostic system for checking motor vehicle control devices, the motor vehicle control devices having self-diagnostic routines which, in the event of malfunctions, store fault codes in motor vehicle-mounted fault memories, and these fault memories can be connected to an external diagnostic tester via a diagnostic interface, a diagnostic program being implemented in the diagnostic tester, characterized in that fault codes and status information relating to fault codes are read out from the control devices and evaluated using the diagnostic program, and in that all the fault codes whose fault setting conditions are met and all the fault codes whose status information indicates that the respective fault codes have not been checked are displayed using the diagnostic tester.

8. The diagnostic system as claimed in claim 7, characterized in that fault codes are cleared on the display of the diagnostic tester only if a status check has yielded that a successful diagnostic run has taken place for the fault codes to be cleared in the control devices.

9. The diagnostic system as claimed in claim 7, characterized in that the status information of selectable fault codes can be interrogated during a repair.

10. The diagnostic system as claimed in claim 7, characterized in that the status checking is carried out whenever a fault code is to be removed from the display of the diagnostic tester.

11. The diagnostic system as claimed in claim 7, characterized in that the status check is triggered on a timed basis.

12. The diagnostic system as claimed in claim 7, characterized in that the removal of fault codes from the display of the diagnostic tester is blocked for those fault codes whose status information in the control devices indicates an untested state.

13. A method for improved checking of repairs, in which firstly fault codes are determined using self-diagnostic routines of control devices and are stored in at least one primary fault memory (A), characterized in that the fault codes which are determined are displayed on the display of the diagnostic tester and at least a partial repair is carried out by means of the fault codes which are determined, in that in a further method step the repair measure carried out is checked using the diagnostic tester by initiating a further diagnostic run, in which the status of the fault codes which are determined is checked by means of status polling.

14. The method as claimed in claim 13, characterized in that those determined fault codes whose status check has revealed the state "not tested" continue to be displayed.

15. The method as claimed in claim 13, characterized in that the checking of repairs is carried out after each partial repair by means of individual fault checking.

16. The method as claimed in claim 13, characterized in that the checking of repairs is carried out at the end of the repair.

* * * * *